United States Patent
Huber et al.

(10) Patent No.: US 6,737,855 B2
(45) Date of Patent: May 18, 2004

(54) ELECTRIC METER COVER INCLUDING AN INTEGRALLY MOLDED OPTICAL PORT WITH LENS

(75) Inventors: Benedikt T. Huber, Victoria (CA); I. Ross Macfarlane, Victoria (CA); Simon H. Lightbody, Victoria (CA)

(73) Assignee: Power Measurement Ltd. (CA)

( * ) Notice: Subject to any disclaimer, the term of this patent is extended or adjusted under 35 U.S.C. 154(b) by 0 days.

(21) Appl. No.: 10/098,762

(22) Filed: Mar. 15, 2002

(65) Prior Publication Data

US 2004/0061490 A1 Apr. 1, 2004

(51) Int. Cl.[7] ................................. G01R 1/04
(52) U.S. Cl. ....................... 324/156; 324/157; 73/431
(58) Field of Search .................. 324/155, 156, 324/157, 96, 110; 73/431; 250/239; 340/870.28

(56) References Cited

U.S. PATENT DOCUMENTS

| | | | | |
|---|---|---|---|---|
| 4,491,793 A | | 1/1985 | Germer et al. ............... 324/157 |
| 4,542,469 A | * | 9/1985 | Brandyberry et al. .. 340/870.28 |
| 5,014,213 A | * | 5/1991 | Edwards et al. ............. 324/116 |
| 5,049,810 A | * | 9/1991 | Kirby et al. ......... 235/144 MA |
| 5,057,767 A | * | 10/1991 | Keturakis et al. ........... 324/156 |
| 5,140,351 A | | 8/1992 | Garcia et al. ............... 385/117 |
| 5,270,639 A | * | 12/1993 | Moore ..................... 324/103 R |
| 5,296,803 A | | 3/1994 | Kirby et al. ................. 324/156 |
| 5,861,742 A | | 1/1999 | Miller et al. ................. 324/156 |
| 6,012,326 A | * | 1/2000 | Raybone et al. ........ 422/186.21 |
| 6,213,651 B1 | * | 4/2001 | Jiang et al. ..................... 385/88 |
| 6,421,361 B1 | * | 7/2002 | Neuberger et al. ............. 372/20 |
| 6,459,258 B1 | * | 10/2002 | Lavoie et al. ............... 324/142 |
| 2002/0039068 A1 | * | 4/2002 | Holowick .............. 340/870.02 |

OTHER PUBLICATIONS

American National Standard for Electronic Time–of–Use Registers for Electricity Meters brochure, The Institute of Electrical and Electronics Engineers, Inc. Copyright ©1991, 17 pages.

ION® 8000 Series product brochure, Power Measurement Ltd., Revision Date Oct. 31, 2001, 8 pages.

* cited by examiner

*Primary Examiner*—Jay Patidar
(74) *Attorney, Agent, or Firm*—Brinks Hofer Gilson & Lione (57) ABSTRACT

A cover for use on an electric meter is disclosed which includes an optical port which aids in transmission of optical signals from an optical transmitter, such as a light emitting diode, to an optical receiver, such as a photodiode or similar. The optical port further includes lenses located in the optical transmission path to focus the optical signal, either convergently or divergently, proximate to the optical receiver thereby improving signal reception.

26 Claims, 9 Drawing Sheets

ELECTRIC METER COVER INCLUDING AN INTEGRALLY MOLDED OPTICAL PORT WITH LENS

BACKGROUND

In a typical electrical distribution system, an electrical energy supplier or utility company generates electrical energy and distributes the electrical energy to consumers via a power distribution network. The power distribution network is the network of electrical distribution wires which link the electrical supplier to its consumers. At the consumer's facility, there will typically be an electrical energy meter, such as a revenue meter, connected between the consumer and the power distribution network to measure the consumer's electrical demand. The revenue meter is an electrical energy measurement device which accurately measures the amount of electrical energy flowing to the consumer from the supplier. The amount of electrical energy measured by the meter is then used to determine the compensation due to the energy supplier.

Even for meters which provide remote communications capabilities, it is often necessary to interact directly with the meter locally, such as to program or configure the meter and/or to upload and/or download data stored in the meter. One method of providing a local user interface to the revenue meter involves utilizing optical communications. Optical Ports, using both the visible and/or infra-red portions of the spectrum, are used on energy meters to allow a quick data and command connection point for a user who is physically proximate to the meter. Further, as will be discussed below, such an optical connection allows a user to electronically interface with the meter without comprising the meter's environmental or security protection provisions.

Typically, the optical port is located on the front of the meter such that the user can connect an optical probe/coupling, such as the U.S. Microtel PM-250, manufactured by U.S. Microtel located in Richardson, Tex., between the meter and their personal computer or other data gathering device. One exemplary probe contains infrared emitting and receiving diodes that "optically mate" with opposing infra-red emitting and receiving diodes located in the optical port of the meter to transmit to and receive data. Energy meters typically have infrared emitting and receiving diodes mounted on the meter's front most printed circuit board where they are both physically and visibly accessible.

In the past, optical ports have been implemented in a variety of ways. Typically, a meter features an injection molded cover for the meter that is made with clear or colored plastic-type material. The optical port is fabricated separately from the meter cover and subsequently fastened to the cover through a secondary operation such as with screws, or press fit, or ultrasonically inserted into the cover, etc. Such secondary operations are costly and require tight tolerances to maintain quality and function. Germer et al, U.S. Pat. No. 4,491,793, discloses an exemplary two piece detachable magnetic coupler which incorporates optical communications.

Further, an advantage of optical based communications is the ability to place the meter's infrared diodes behind the meter cover to environmentally protect them, as well as the other meter electronics, while still making them visibly accessible. As will be appreciated, however, enclosing the infrared diodes may impede the transmission of the optical signals between the transmitter and receiver. Typical optical port designs, known in the art, have taken measures to improve the light transmission through the meter cover between the diodes and the optical device coupled with the port. However, problems still exist when manufacturing or assembling the meter cover and attaching the meter cover to the main body of the meter containing the meter electronics and optical transceivers since tolerances in both the manufactured parts and the assembly process may cause the internal structure of the assembled meter, and therefore the optical transceivers, to misalign with the cover and the portion thereof defining the optical port, for example, lean or twist with relation to the cover. This may result in misalignment between the optical probe and optical transceivers when the probe is coupled with the meter.

U.S. Pat. No. 5,861,742 (Miller) describes an integrally molded optical port having light pipes disposed in the cover, the light pipes being aligned with the emitting and receiving diodes of the device electronics and an optical probe coupled with the optical port. Light pipes are designed to transmit light from a source, through a transparent pipe, and to an outlet using total internal reflection in the pipe interface to keep the light beams within the light pipe. One disadvantage of this approach is that the alignment of the light pipes to the meter's infrared diodes is critical and tolerances must be kept very tight. A slight offset in alignment can mean failure of light transmission and allow external light to interfere with the operation of the optical port. Further, the use of light pipes requires that the side walls of the light pipes be extremely defect free or the optical transmission may degrade by loss due to scattering. To combat this, some designs utilize a dark material to block interfering light from the light being transferred between the Optical Port and the Optical Probe, however this adds to the assembly and part cost. Other designs utilize cylindrical tubes to direct the light to and from the meter and the optical probe.

Still other designs take the infrared diodes from the meter and place them directly into the fastened optical port. However, all present designs have to deal with the functional limitations of infrared diodes. For example, the diode's light signal strength is limited and, therefore, the path from an emitting diode to a receiving diode must be very clear of obstructions and must be aligned with the light transmission means.

Thus, there is the need for an improved meter cover that provides an optical port having a lower manufacturing cost and improved tolerances for transceiver signal strength and alignment, while maintaining the cover's environmental and tamper resistant integrity.

SUMMARY

The present invention is defined by the following claims, and nothing in this section should be taken as a limitation on those claims. By way of introduction, the preferred embodiments described below relate to an electric meter cover comprising an optical port, the optical port operative to allow transmission of an optical signal through the electric meter cover, the optical port further comprising a lens operative to focus the optical signal.

The preferred embodiments further relate to a method of transmitting signals between an electric meter housed within a cover and external an optical device, the cover having at least one lens, the electric meter including a diode located proximate to the lens. In one embodiment, the method comprises coupling the optical device to the cover, transmitting the signal from said diode through the lens, whereby the lens is operative to focus the signal proximate to a receiving diode located external to the cover.

BRIEF DESCRIPTION OF THE DRAWINGS

FIG. 5 illustrates a second perspective view of the electric meter cover of FIGS. 1, 2 and 4a.

DETAILED DESCRIPTION OF THE PRESENTLY PREFERRED EMBODIMENTS

The present invention relates generally to the field of electricity meter covers and, more particularly, to an integrated molded electricity meter cover including an improved optical port. Optical communications methods, using infrared or visible spectrum, etc., are often used for communicating data and commands to/from an electronic device, such as an electric utility type meter. Other types of intelligent electronic devices, such as programmable logic controllers ("PLC's"), remote terminal units ("RTU's"), protection relays (protective relays) and fault recorders also utilize this type of optical communications. Such communications are typically facilitated by an optical port located on the device to which a suitable communications device may be coupled.

Figure 1:
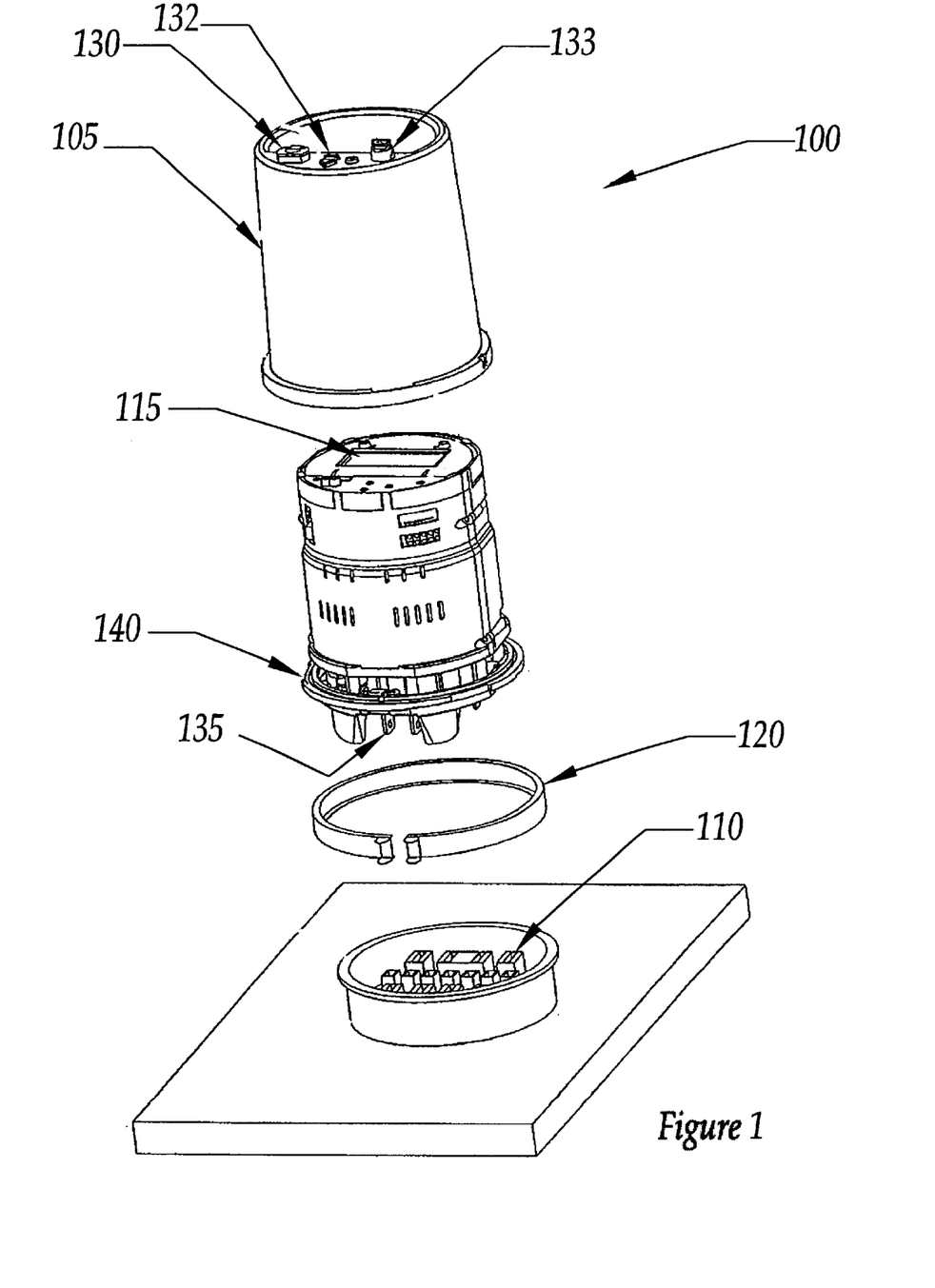
FIG. 1 depicts a perspective, exploded view of an exemplary S-base revenue meter, and meter cover.
Figure 2:
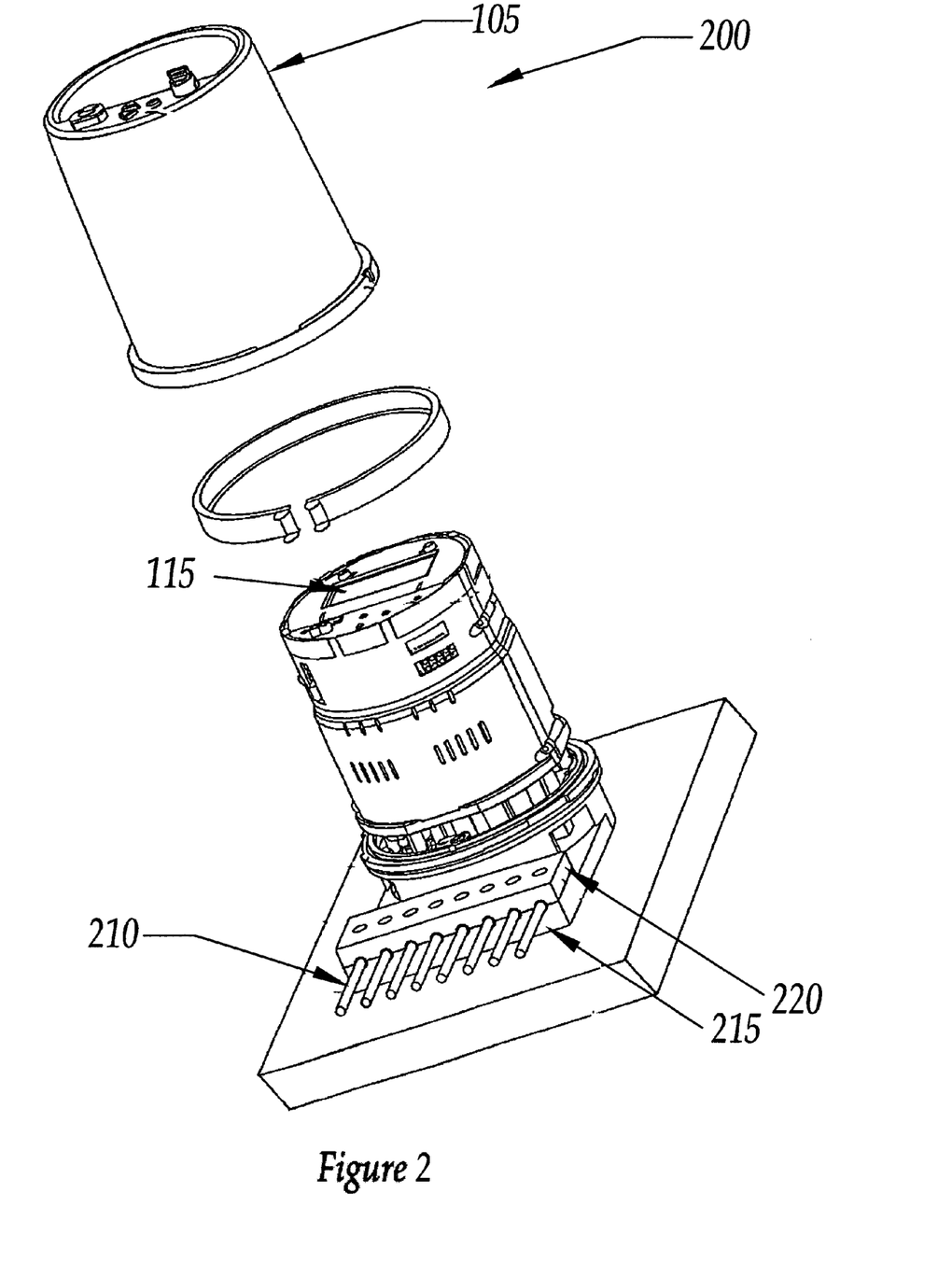
FIG. 2 depicts a perspective, exploded view of an exemplary A-Base revenue meter, and meter cover.
Figure 3:
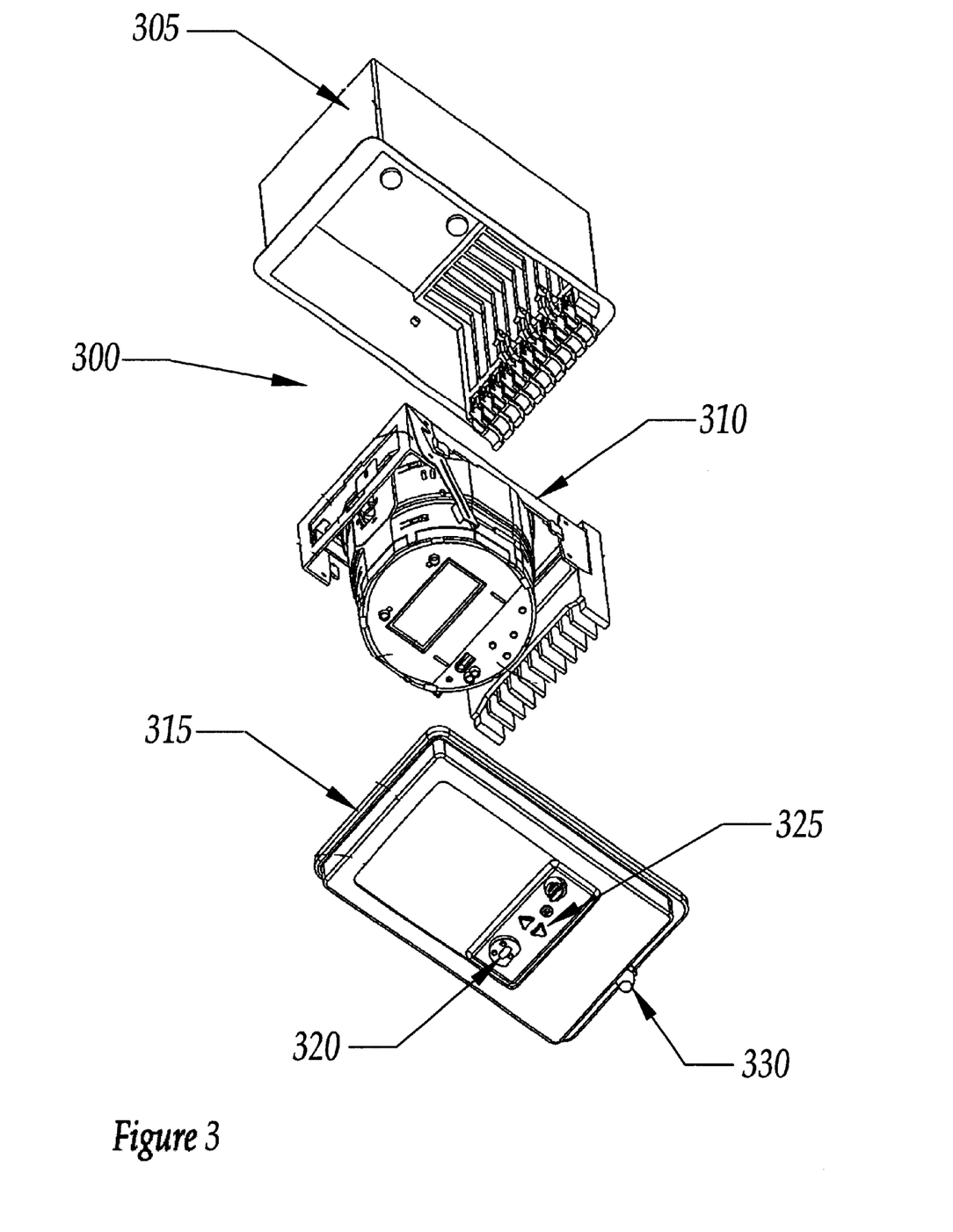
FIG. 3 depicts a perspective, exploded view of an exemplary Switchboard revenue meter, and meter cover.

Referring to FIGS. 1–3, the American National Standards Institute ("ANSI") defines two general types of revenue meters, socket based ("S-base" or "Type S") (shown in FIG. 1) and bottom connected ("A-base" or "Type A") (shown in FIG. 2). A third type of revenue meter, known as a "Switchboard Meter" or "Draw-out Meter", is also commonly used in the industry (shown in FIG. 3). While all of these types of meters provide similar functionality used to measure and record various power parameters of the electric circuit to which they are attached, they are distinguished, in at least one respect, by the method in which they are coupled with the electric circuit that they are monitoring. Herein, the phrase "coupled with" is defined to mean directly coupled with or indirectly coupled to through one or more intermediate components.

FIG. 1 shows a diagram of an exemplary S-base revenue meter 100, such as an ION 8500 Revenue Meter manufactured by Power Measurement Limited, Saanichton, British Columbia, Canada. S-base meters 100 include blade type terminals 135 disposed on a base 140 of the meter 100. These blade terminals are designed to mate with matching jaws of a detachable meter mounting device such as a revenue meter socket 110. The socket 110 is hard wired to an electrical circuit (not shown) and is not meant to be removed. An exemplary meter socket 110 is the 3000 Series manufactured by Meter Devices Co., Inc., Canton, Ohio.

S-base meters include a cover 105 which encloses the meter's electronics and display 115. A sealing mechanism 120 secures the cover 105 to prevent unauthorized access to the meter electronics. Removal of the meter 100 necessitates disengaging a t-seal (not shown) that seals the cover 105 and the revenue meter 100, which would indicate unauthorized tampering. At least one input device, such as an optical port 130 and/or a keypad 132, is provided on a top/front, e.g. accessible, portion of the cover 105 to allow a user access to the meter's 100 functionality and allow the user to interact with the meter 100 without requiring removal of the cover 105.

FIG. 2 shows a diagram of an exemplary A-base revenue meter 200. The A-base meter 200 includes bottom connected terminals 210 on the bottom side 215 of the meter 200. The terminals 210 are typically screw terminals for receiving the conductors of the electric circuit. A-base meters 200 are directly connected to the electric circuit and can only be installed or removed by connecting or disconnecting the conductors of the electric circuit. Typically, this means tightening or loosening each terminal 210 to secure or free the end of the conductor. Similar to the S-base meters 100, A-base meters 200 utilize a cover 105 to enclose the meter electronics and the display 115. It will be appreciated that the A-base meter 200 and the S-base meter 100 may utilize the same cover 105, as well as similar internal meter circuitry. Further, as described with regard to the S-base revenue meter 100, the A-base meter typically utilizes a t-seal (not shown) to prevent unauthorized tampering with the meter electronics. For the purposes of this disclosure, A-base meters also include S-base meters in combination with A-base adapters 220. An exemplary A-base adapter is the Polyphase Transformer Rated A to S Adapter manufactured by Ekstrom Industries, Incorporated, located in Farmington Hills, Mich.

FIG. 3 shows a diagram of an exemplary Switchboard Meter, 300. The Switchboard meter 300 includes a switchboard enclosure 305 which is physically mounted and connected with the electrical circuitry. Exemplary enclosures are the ABB FT-21 and ABB-FT-32 manufactured by ABB, located in Raleigh, N.C. The switchboard meter 300, which includes the meter electronics and display, is mounted on a draw-out chassis 310 which is removable from the switchboard enclosure 305. The draw-out chassis 310 interconnects the meter electronics with the electrical circuit. The enclosure 305 also has a cover 315 which completely seals the meter inside the enclosure. The cover 315 includes the optical port 320, keypad 325, or input device for accessing the meter's electronics. The cover 315 has a sealing mechanism 330 which prevents removal of the cover 315 and indicates when the cover 315 has been tampered with.

Referring to FIGS. 1–3, the S-base and A-base revenue meters' cover 105, and the Switchboard revenue meter's cover 315, are at least partially transparent. The transparency permits viewing of the meter's display including a graphic user interface (GUI) 115 without having to remove the cover 105 315. As mentioned above, the meter cover 105 315 further provides an optical port 130 and/or a context adaptable input device such as the keypad 132 for interacting with the revenue meter while the meter cover 105 315 remains in place.

Figure 4A:
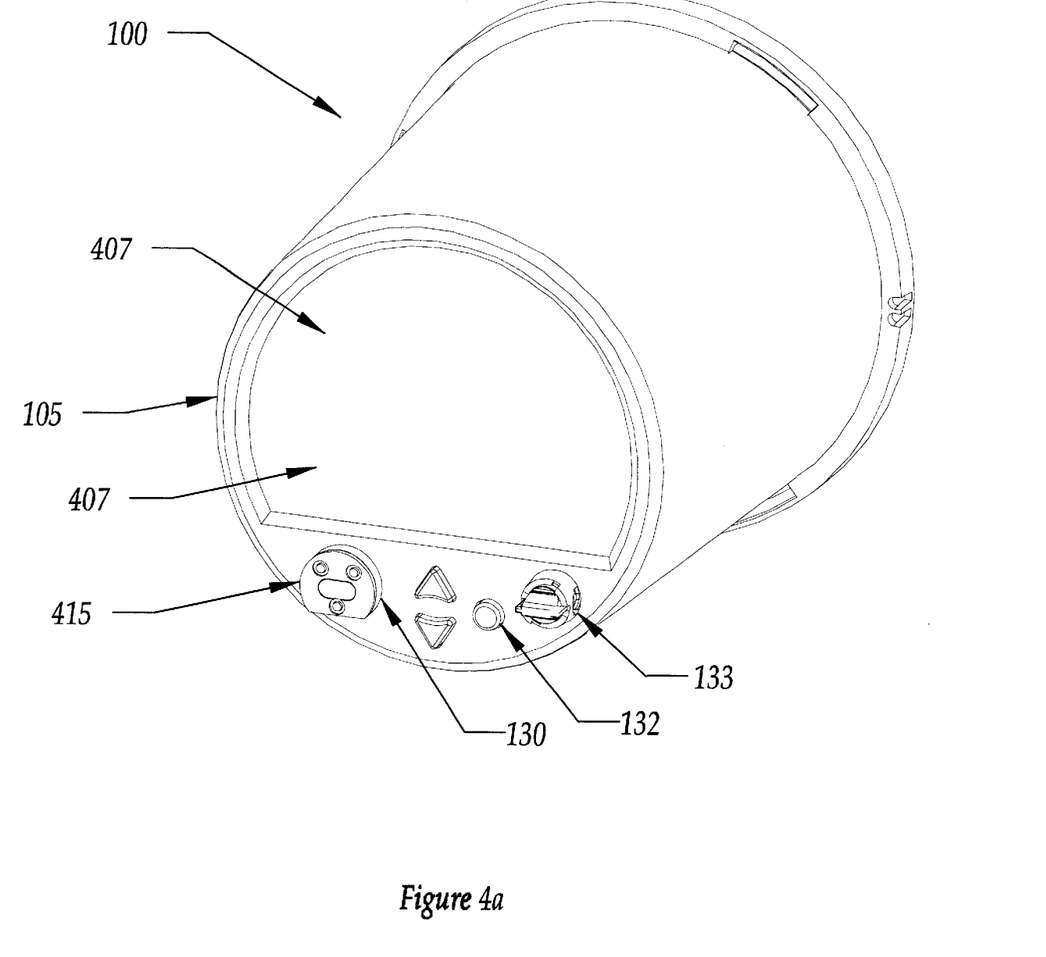
FIG. 4a is a perspective view of the electric meter of FIGS. 1 and 2.

FIG. 4a illustrates a perspective view of a cover 105 of the meter 100 200. The cover 105 has a optically clear viewing window 407, which is preferably integrally molded into the cover 105. Typically the cover 105 is injection molded using a polycarbonate type material. The cover 105 has an optical port 130, coupled with an optical plate 415. Typical optical port dimensional specifications are outlined in American National Standards Institute ("ANSI") C12.13, herein incorporated by reference. An optical probe (not shown) is used to connect a PC or similar data collecting device to the device 100 via the port 130. The probe mounts on the optical port 130 by way of a magnetic coupling. The optical port 130 will typically have a metal plate 415 that a magnet in the optical probe magnetically "adheres" to. The optical port and the probe contain corresponding Light Emitting Diodes and/or Infrared Emitters and photodiodes used to facilitate communications via the exchange of optical signals. It will be appreciated that other optical transceiver technologies, now or later developed, may also be used.

In one embodiment the viewing window 407 is manufactured so as to be shaped in the form of a magnifying lens, thereby magnifying the appearance of the display 115 or other labels or text to the user fixed behind the viewing window 407.

Light Emitting Diodes (LED's), and Infrared Emitters (IR's) are electrical components that can be used to emit light, either in the visible, infrared or other spectra, by passing a current through them. Altering the voltage applied across the LED or IR controls the current and thereby, the emitted light. The light can be quickly turned on and off by altering the voltage. Such Voltage changes can typically be produced by simple digital electronic hardware. Thus, light can be used to transmit a representation of the digital signal.

Photodiode components are also used in the form of light receivers. When light is received/sensed, current starts to flow, i.e. current flow is induced across the photodiode. The anode of the photodiode is connected to ground, while the cathode is connected to a positive voltage, such as +5 volts DC through a resistor. As the current starts to flow, the voltage across the photodiode will drop. If light is present, the voltage drop is low, for example zero voltage, whereas if no light is present the voltage drop is high, for example +5.0V. With known logic hardware this voltage rise and subsequent fall may be translated into a useful digital signal representing, for example, data or commands.

The combination of LED or IR emitters and Photodiode receivers, in further combination with known circuitry, facilitates digital communications between electronic devices utilizing an optical signal carrier which may be used to communicate data and/or commands from one point to another. It is customary for the optical port to make use of one emitter LED or IR for transmitting data or commands from the meter and one photodiode receiver for receiving data or commands from an external source. The meter's LED/IR and Photodiode transceiver pair optically "mate" with a corresponding transceiver pair on the device to be communicated with via the optical port. It will be appreciated that a meter may have more than one LED or IR for transmitting and/or more than one photodiode for receiving.

The characteristics of a photodiode's ability to receive data are dependent on the intensity of the light received. It will be appreciated that a higher intensity will produce a higher voltage and subsequently a stronger more robust and noise free digital signal, i.e., having a higher signal to noise ratio. It will therefore be appreciated that maintaining the intensity of transmitted light is a critical factor in the design of a light, or optical, communication port 130. It is therefore desirable to implement an optical port that will not diminish the light intensity emitted by the meter's transmitting LED or otherwise inhibit reception by the meter's receiving photodiode.

For protection and functionality, emitters and receivers within optical ports 130 are typically enclosed and sealed off from an external environment. This is conventionally accomplished by covering the LED and/or photodiode with a transparent plastic or glass material. A similar material is also used to protect the internals of the optical probe. The ability to environmentally seal off the electronic components of the optical port without inhibiting operation is one of the advantage of utilizing optical communications.

The meter cover 105 also has a context adaptable input device, such as a keypad 132, which allows access to the meter's electronics without requiring removal of the cover 105 from the meter 100. The cover 105 also contains a demand reset key 133, which is known in the art.

Figure 4B:
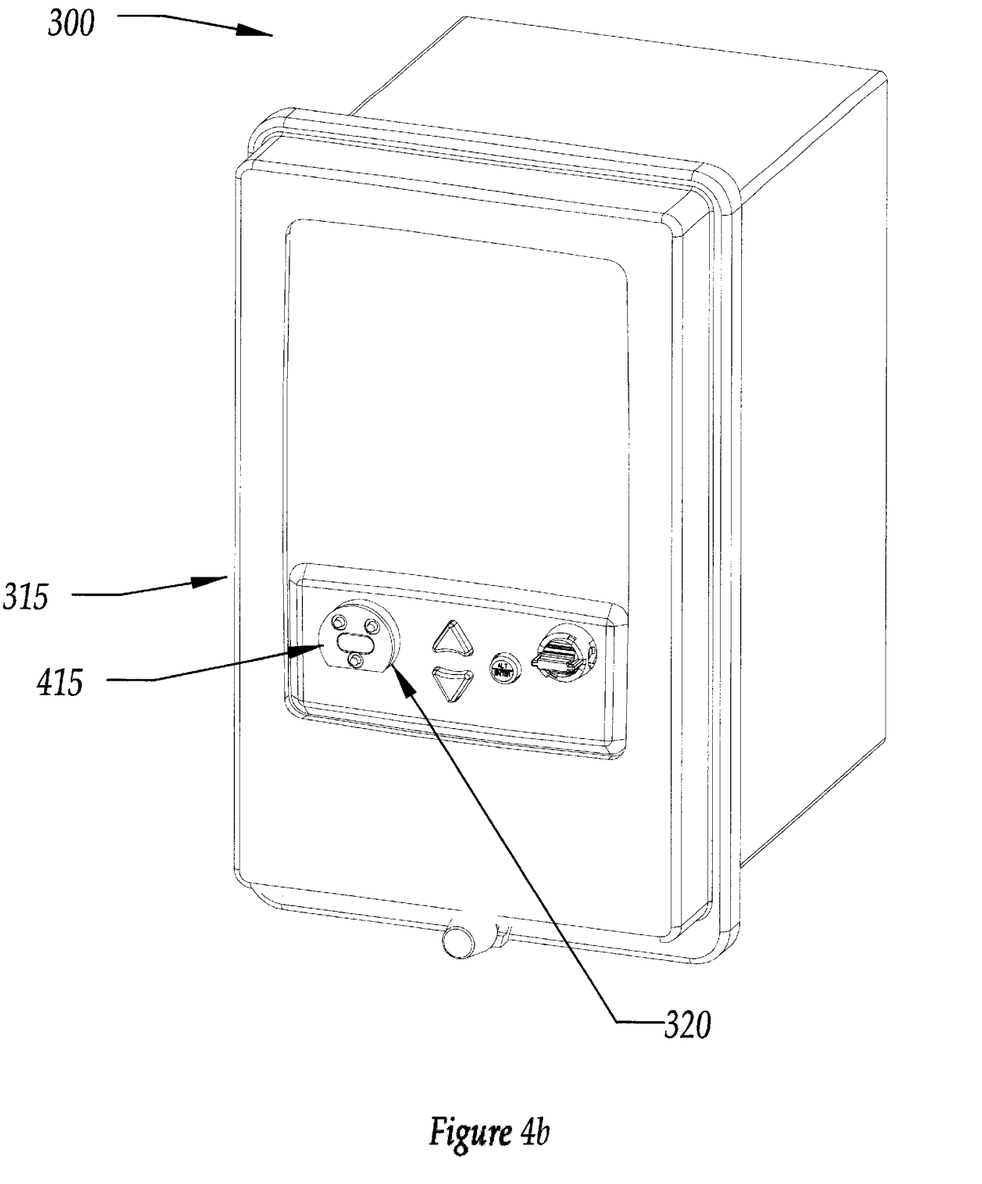
FIG. 4b is a perspective view of the electric meter of FIG. 3.

FIG. 4b illustrates a perspective view of a "Switchboard Meter" or "Draw-out Meter" 300, also commonly used in the industry. As described in FIG. 4a above, the Switchboard Meter cover 315 also has an optical port 320, which is coupled with a metal plate 415. As was discussed, while the S-base, A-base and Switchboard meters are distinguished, in at least one respect, by the method in which they are connected with the electric circuit that they are monitoring, their internal electronics and, in particular, the optical ports 320 are similar and the disclosed embodiments are applicable to each.

Figure 5:
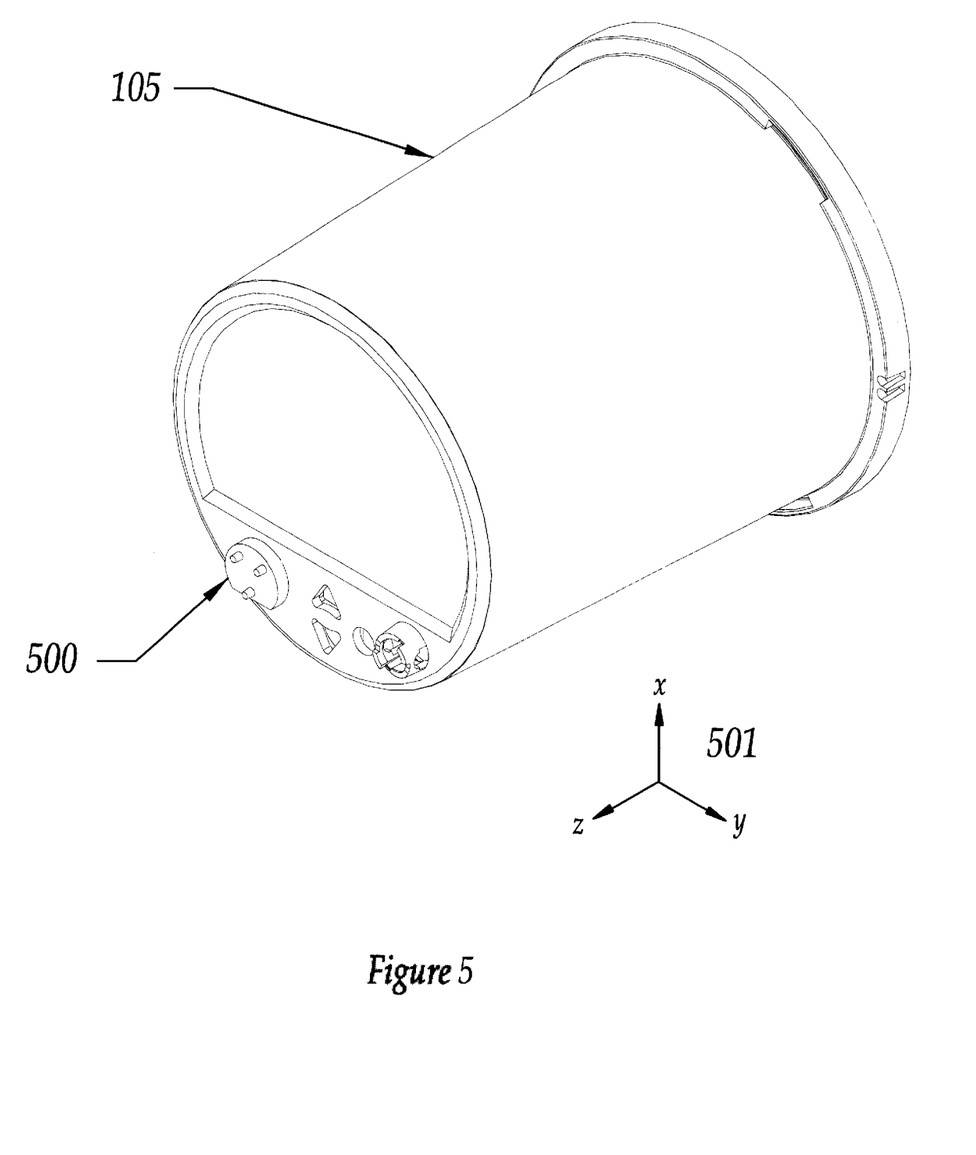

FIG. 5 illustrates a perspective view of the electric meter cover 105, which shows the optical port 500 integrally molded with the cover 105, prior to assembly of the metal plate 415 (not shown in figure). It will be appreciated by one skilled in that art that this one piece molded design offers cost and manufacture savings in the form of reduced materials and assembly operations. Alternately, the optical port or optical port assembly can be inserted or attached to the cover separately. Typically, the device cover is transparent and transmits the optical signals from/to the optical probe's emitter/receiver to/from the device's receiver/emitter with minimal impedance and substantially unaltered.

Figure 6:
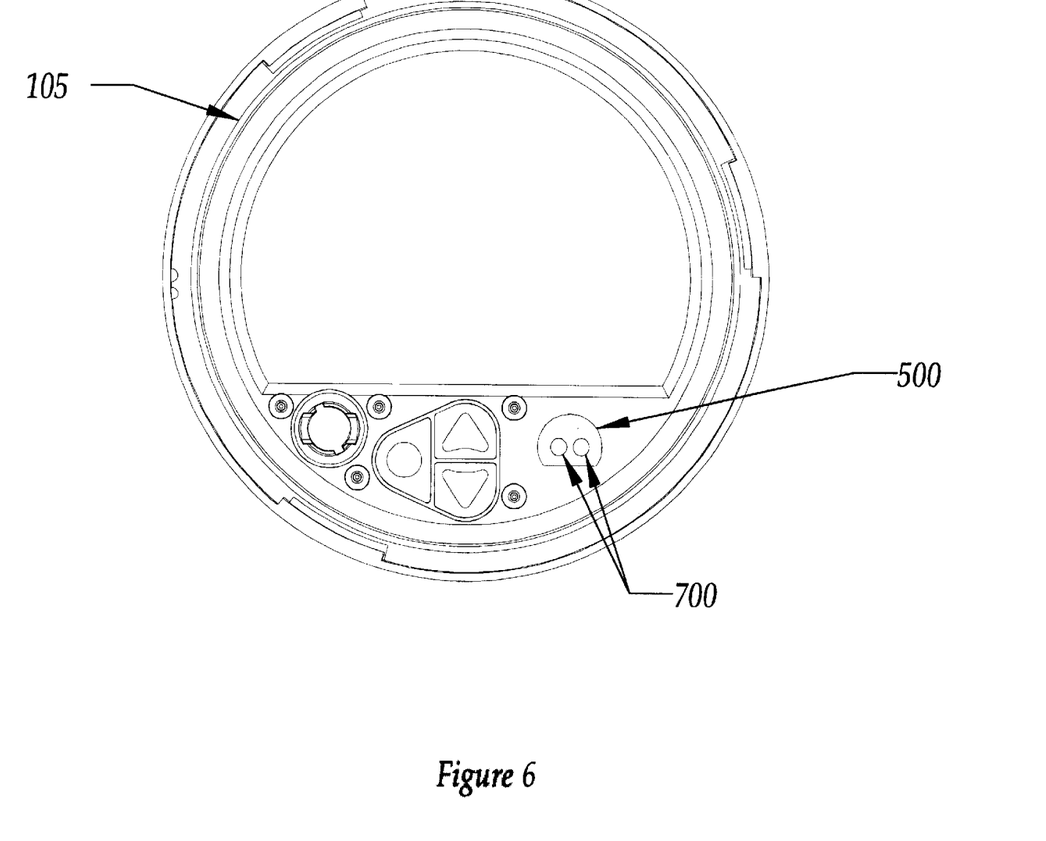
FIG. 6 illustrates a back view of the electric meter cover of FIG. 5.

FIG. 6 illustrates a back view of the electric meter cover 105 showing one embodiment of the lenses 700, discussed in more detail below, disposed on the optical port 500. The lenses 700 collimate and/or focus and adjust the line of sight from the optical signal coming from the emitter going to the receiver, either from the optical probe to the meter or vice versa. It will be appreciated, that the term focus includes altering either the convergence or divergence of rays of light passing through the lens with respect to a focal point. In the present embodiment, the lenses 700 may be used to adjust one or both of the divergence or convergence of the optical signal emitted by the LED/IR emitter of the probe or meter upon a focal point located between+/−infinity. Due to symmetry of the optics, the optical port lens assembly is bi-directional. Further, in the present embodiment, both the front face of the optical port 500 and the lenses 700 are optically clear so that the transmitted light is not refracted in an unknown direction.

The use of lenses 700 offers an improvement over the prior art of using light pipes to conduct the optical signal between the transceivers. Light pipes, as known in the art, allow transmission of light from a source through a transparent pipe to an outlet using internal reflection in the pipe to keep the light beams within the pipe. An exemplary meter cover using a light pipe is shown in Miller et al, U.S. Pat. No. 5,861,742. One advantage of using lenses 700 is that the exact orientation of the lens in the xy-plane 501 (shown in FIG. 5) is not critical whereas if a light pipe is out of alignment, the assembly may not function. A second advantage is that the use of lenses gives improved light pickup from the receiver and improved gain of the optical signal due to the focusing of the transmitted light. A third advantage is that the size of the lens 700 may be increased, as a larger lens will give improved light collection ability. In contrast, increasing the size of a light pipe to increase its collection ability to achieve a similar result may be restricted due to injection molding defects, known as sink marks, when a large volume of plastic is molded. Further, light pipes must be optically clear on all surfaces or scattering and degradation of the optical signal will occur. Lenses have significantly less surface area than light pipes and manufacturing optically clear lenses with no defects is a simpler and less costly task. An additional advantage of lenses 700 is a higher tolerance for misalignment. If alignment of the light pipes to the light emitter or receiver is not correct, the emitter may not transmit the optical communication or the receiver may not receive the transmission. Lenses offer the manufacturer and customer room for increased tolerances in both the positioning of the emitter and receiver.

In one embodiment of the disclosed invention, optical lenses 700 are integrally molded into the meter cover/housing. The optical lenses aid in collecting the light emitted from a dispensing beam from the emitter LED or IR, and refocusing and/or collimating the light on or proximate to the receiving photodiode. In this embodiment, the emitter is a type HSDL-4220 High-Performance Infrared (875 nm) Lamp manufactured by Agilent Technologies located in Santa Clara, Calif., and the receiver is a Silicon PIN Photodiode type SFH 203FA manufactured by OSRAM Opto Semiconductors GmbH & Co, located in Germany. Further, in this embodiment, the distance between the transmitter/receiver and the lens is ~10 mm (0.40"), the lens having a radius of 6.22 mm (0.245") and a focal point of 11–12 mm (0.43"–0.47") on either side of the lens 700 which focuses the light beam proximate to the optical probe emitter/receiver. The focal length of the lens is chosen so that the light leaving the emitter will end up as close as possible to the photodiode receiver. In operation, the exact value of the focal point is the average of the minimum and maximum expected range in the z-plane 501 of placement of the LED/IR and the photodiode. In one embodiment the focal point is at the photodiode but in an alternate embodiment the focal point is in front or behind the photodiode. Moving the focal point away from the photodiode in the z-plane 501 allows for a larger tolerances in displacement of the emitter/receiver in the xy-plane 501. In operation, with the focal point at the emitter or receiver the optical probe will work with the aforementioned emitter/receiver and lens optics up to a distance of 0.5" from the optical port.

In operation an optical probe comprising a emitter and receiver is coupled with an optical port on a device. Light from the emitter on the optical probe is transmitted through the cover, and lens apparatus and into the device receiver. The thickness of the cover, approximately 0.10", has negligible effect on the transmission of the optical signal as the thickness of the cover does not significantly effect the focal length.

Figure 7A:
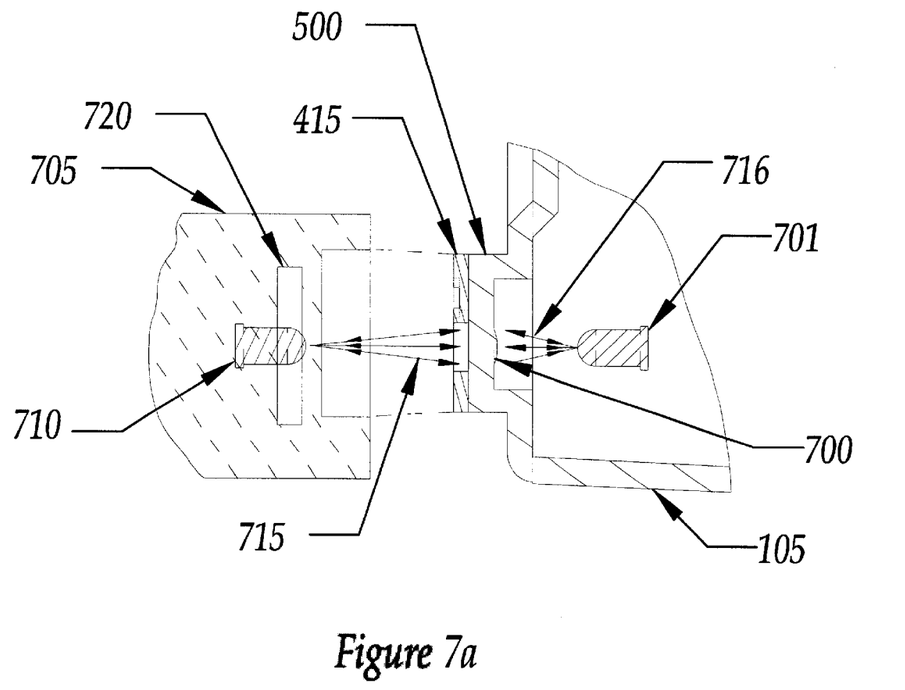
FIG. 7a illustrates a cross-sectional portion of the electric meter cover of FIG. 5 coupled with a receiver according one embodiment.

FIG. 7a illustrates a cross-sectional portion of the electric meter cover 105 that, when in operation, is coupled with an optical probe 705. An integrated, one piece, molded, optical port 500 reduces manufacturing cost and utilizes lenses 700 to focus the light traveling to and from the infrared emitters and receivers. Typically, the LED's 701 710 and IR's 710 emit light in a specified beam direction. Utilizing lenses 700 to focus this light and transfer it from the emitter to the receiver increases reliability of the optical communication thereby increasing reliability of the optical transmission. Further, the higher the lux value, the stronger the signal that will be generated by the LED or IR (a lux is a measure of brightness). Focusing the beam will increase the lux value, at the focal point, to a higher value than otherwise attainable by the emitter at the given distance. Alternately, the lenses 700 can be utilized to disperse the optical transmission, allowing a wider range of transmission than originally intended by the emitter characteristics. Further, using a larger lens will give an increased lux value.

The optical port 500 is disposed within the cover 105 and is coupled with a metal plate 415. The optical probe 705 contains a probe magnet 720 and probe LED or IR 710 which emits a light beam 715 which is refocused by the lens 700 and received by the device receiver/photodiode 701. Alternately the device LED or IR 701 emits a light beam 716 which is refocused by the lens 700 and received by the probe photodiode 710.

Figure 7B:
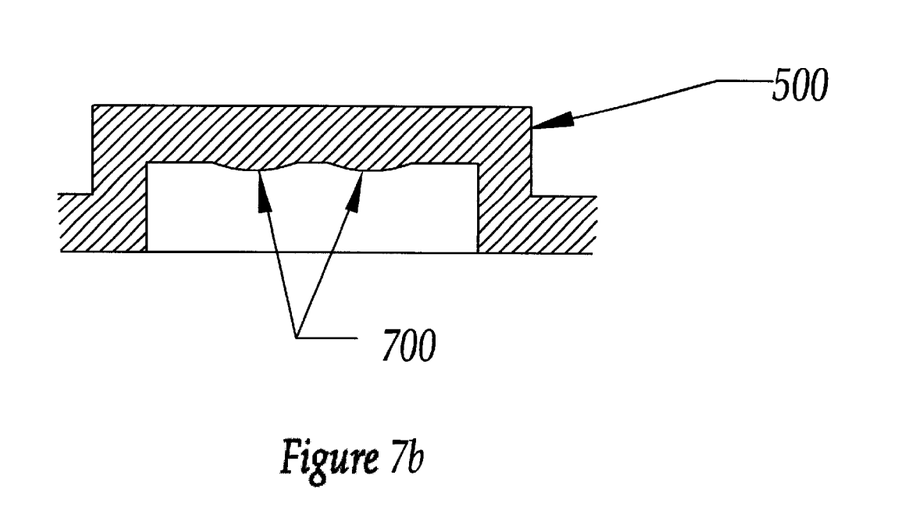
FIG. 7b illustrates an alternate cross-sectional view of the optical port of the electric meter cover of FIG. 5 according to one embodiment.

As shown in FIG. 7b, the lens 700 is convex but it can be appreciated by one skilled in the art that a concave lens may also be used to disperse the light transmission to further reduce the need for high tolerances of emitter/receiver placement in the xy-plane 501 (See FIG. 5). For the purposes of injection molding a lens inside the optical port, it is typically more cost effective to mold a convex lens. Alternately, in a second embodiment, a combination of a convex and concave lens may also be used in place of the two convex lenses. In a third embodiment, a double convex lens, convex-concave lens or double concave lens may be used.

In a fourth embodiment, not shown, the lens 700 or the entire optical port 500 can be inserted separately from the cover 105. It will be appreciated by one skilled in the art that the lenses 700 or optical port 500 can be ultrasonically welded, attached with adhesive such as glue or press-fit into place. An advantage of a two piece design allows for the switching of lenses in a cover without the need of replacing the entire cover.

Figure 8:
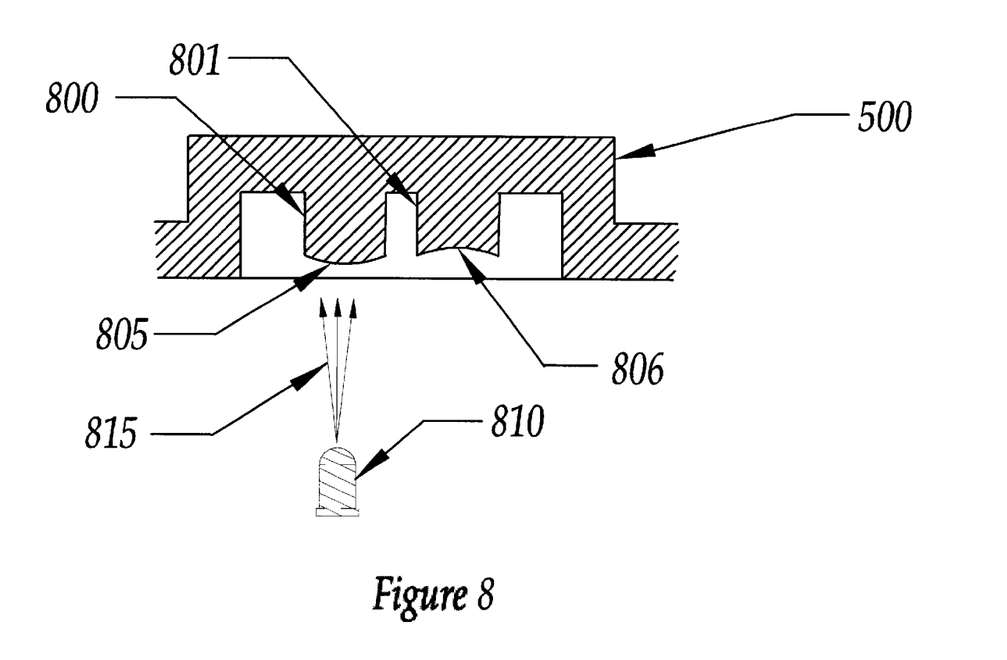
FIG. 8 illustrates a cross-sectional view of the optical port of the electric meter cover of FIG. 4 according to another embodiment.

Referring now to FIG. 8, a fifth embodiment cross-sectional portion of the optical port 500 is shown. The optical port 500 contains light pipes 800 801 with lenses 805 806 disposed on the end of the light pipes. Again, it will be appreciated that convex, concave or a combination of both types of lenses can be utilized on the end of the light pipes. For example, a LED 810 emits an infrared beam 815 towards a light pipe 800 and a lens 805 is disposed on the end of the light pipe 800 which collects and refocuses the infrared beam 815 into the light pipe 800, the light pipe aiding in transmission of the optical signal through the optical port and cover material. As described earlier, the use of light pipes has known disadvantages. However, with the addition of lenses disposed on the light pipes, the lenses 805 806 aid in refocusing or dispersing the incoming light into the light pipe 800 801 and decrease the need for improved manufactured or assembled IED/IR/photodiode placement tolerances to accommodate for mis-alignment of emitters or receivers. Further, the use of lenses in combination with a light pipe reduces the need of reliance of internal reflection of the light pipes.

Figure 9:
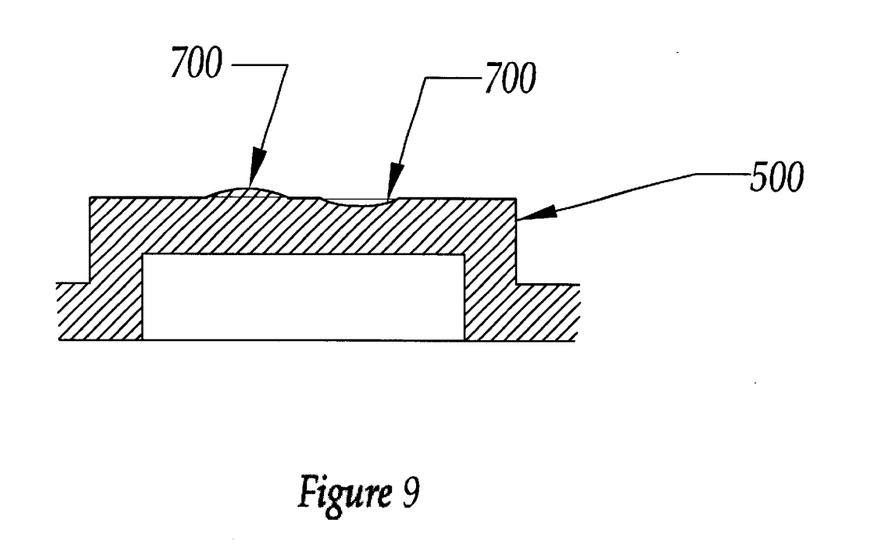
FIG. 9 illustrates a cross-sectional view of the optical port of the electric meter cover of FIG. 4 according to another embodiment.

In a sixth embodiment, shown in FIG. 9, the lenses 700 may be disposed on the exterior of the optical port 500 or cover (not shown). Again, it will be appreciated that convex, concave or both types of lenses can be disposed on the top of the cover or optical port 500.

In yet another embodiment, a combined optical transceiver device may be utilized requiring only a single lens. For example, a device comprising both an emitter and receiver and which transmits a signal utilizing a first wavelength and receives a signal on an alternate non-interfering wavelength may be used in conjunction with an optical probe having corresponding capabilities. In this case, such a single transceiver device requires only a single lens.

Further, in applications wherein it is desirable only to focus an optical signal generated by the meter but not to focus the optical signal generated by the optical probe, or vice versa, only a single lens may be used to focus the particular signal It is therefore intended that the foregoing detailed description be regarded as illustrative rather than limiting, and that it be understood that it is the following claims, including all equivalents, that are intended to define the spirit and scope of this invention.

We claim:

1. An electric meter cover comprising an integrally molded optical port and at least one light pipe, said light pipe further comprising a lens, said light pipe operative to allow transmission of an optical signal toward said lens and wherein said lens is operative to focus said optical signal, wherein said lens is integrally molded into said electric meter cover.

2. The electric meter cover of claim 1 wherein said lens is further operative to cause said optical signal to converge toward a receiver proximate to said lens.

3. The electric meter cover of claim 1 wherein said optical signal is transmitted by a transmitter proximate to said lens.

4. The electric meter cover of claim 1 wherein said optical signal comprises a communications signal.

5. The electric meter cover of claim 1 wherein said cover comprises a plastic material.

6. The electric meter cover of claim 1 further comprising an integrally molded viewing window.

7. The electric meter cover of claim 6, wherein said integrally molded viewing window operative to magnify an appearance of a display proximate to said integrally molded viewing window.

8. The electric meter cover of claim 1 wherein said lens is convex.

9. The electric meter cover of claim 1 wherein said lens is concave.

10. The electric meter cover of claim 1, wherein said optical signal comprises a wavelength located substantially within the visible spectrum.

11. The electric meter cover of claim 1, wherein said optical signal comprises a wavelength located substantially within the infrared spectrum.

12. The electric meter cover of claim 1, wherein said electric meter cover further comprising a second integrally molded lens operative to allow a transmission of a second optical signal.

13. The electric meter cover of claim 12, wherein said second integrally molded lens is operative to cause said second optical signal to substantially converge toward a receiver proximate to said second integrally molded lens.

14. A meter comprising:
a housing defining an interior portion and an exterior portion, said meter located in said interior portion, said housing including an optically transmissive portion operative to convey an optical signal between said interior and exterior portions; and
wherein said meter further comprises an internal optical transmitter, said internal optical transmitter located within said housing and substantially proximate to said optically transmissive portion, said internal optical transmitter operative to generate a first optical signal to an external optical receiver, said external optical receiver located in said exterior portion; and
further wherein, said optically transmissive portion further comprises a first integrally molded lens, said first integrally molded lens operative to focus said first optical signal.

15. The meter of claim 14, wherein said lens is convex.

16. The meter of claim 14 wherein said lens is concave.

17. The meter of claim 14, further comprising an internal optical receiver located within said housing and substantially proximate to said optically transmissive portion, said internal optical receiver operative to receive a second optical signal from an external optical transmitter located in said exterior portion and wherein said optically transmissive portion further comprises a second integrally molded lens operative to focus said second optical signal.

18. The meter of claim 17, wherein said second integrally molded lens is operative to cause said second optical signal to substantially converge upon said internal optical receiver.

19. The meter of claim 14, wherein said first optical signal comprises a wavelength located substantially within the visible spectrum.

20. The meter of claim 14, wherein said first optical signal comprises a wavelength located substantially within the infrared spectrum.

21. The meter of claim 14, wherein said first integrally molded lens is operative to cause said first optical signal to substantially converge upon said external optical receiver.

22. The meter of claim 14, wherein said first integrally molded lens is operative to increase a divergence of said first optical signal.

23. The meter of claim 14, wherein said housing further comprises a viewing window, said meter comprising a display located in said interior portion and proximate to said viewing window, said viewing window operative to magnify an appearance of said display to said exterior portion.

24. The meter of claim 14, wherein said housing further comprises a viewing window.

25. The meter of claim 14, wherein said housing comprises a plastic material.

26. The meter of claim 14 wherein said optical signal comprises a communications signal.

* * * * *